United States Patent
Mouret et al.

(10) Patent No.: US 12,542,539 B2
(45) Date of Patent: Feb. 3, 2026

(54) SWITCHABLE TERMINATION RESISTANCE CIRCUIT

(71) Applicant: NXP USA, INC., Austin, TX (US)

(72) Inventors: Guillaume Mouret, Portet-sur-Garonne (FR); Alexis Nathanael Huot-Marchand, Labastidette (FR); Soufiane Serser, Toulouse (FR)

(73) Assignee: NXP USA, Inc., Austin, TX (US)

( * ) Notice: Subject to any disclaimer, the term of this patent is extended or adjusted under 35 U.S.C. 154(b) by 66 days.

(21) Appl. No.: 18/596,824

(22) Filed: Mar. 6, 2024

(65) Prior Publication Data
US 2024/0333262 A1 Oct. 3, 2024

(30) Foreign Application Priority Data

Mar. 24, 2023 (EP) ..................................... 23305410

(51) Int. Cl.
*H03H 11/28* (2006.01)
*H03K 17/687* (2006.01)

(52) U.S. Cl.
CPC ......... *H03H 11/28* (2013.01); *H03K 17/6872* (2013.01)

(58) Field of Classification Search
CPC ............... H03H 11/28; H03K 17/6872; H03K 17/6871; H03K 17/6877; H03K 19/017545; H03K 19/0005; H03K 19/01825; H03K 19/01831; H03K 19/018557; H03K 19/018564; H03K 19/018571; H04L 25/0266; H04L 25/0278; H04L 25/0298;
(Continued)

(56) References Cited

U.S. PATENT DOCUMENTS 6,078,204 A 6/2000 Cooper et al.
6,590,413 B1 7/2003 Yang
(Continued)

FOREIGN PATENT DOCUMENTS

CN 212183126 U 12/2020
EP 0289560 B1 4/1992
(Continued)

OTHER PUBLICATIONS

Young, I., "A Low-Power NMOS Transmit/Receive IC Filter for PCM Telephony", IEEE Journal of Solid-State Circuits, vol. SC-15, No. 6, Dec. 1980.

*Primary Examiner* — Jung Kim

(57) ABSTRACT

An apparatus comprising: a driving circuit; a switchable termination resistance circuit configured to selectively provide a resistance based on an output of the driving circuit; wherein the output of the driving circuit is provided by a parallel arrangement of a first branch having a first switch and a second branch having a second switch, wherein the second branch provides greater current than the first branch, and wherein the driving circuit is configured to provide, in response to an enable signal received at an input of the driving circuit, the output comprising a first current by turning on the second switch for a predetermined time period following the provision of the enable signal to cause the provision of the termination resistance, and, after said predetermined time period, turn off the second switch such that the output comprises a second current, less than the first current.

20 Claims, 5 Drawing Sheets

(58) Field of Classification Search
CPC ............. H04L 25/0272; H04L 25/0264; H04L 25/0274; H04Q 1/30; G06F 13/4086; H05K 1/0246
See application file for complete search history.

(56) References Cited

U.S. PATENT DOCUMENTS

| | | | |
|---|---|---|---|
| 6,992,501 B2 | 1/2006 | Rapport | |
| 2010/0289521 A1* | 11/2010 | Nakata | ................ H04L 25/0278 326/30 |
| 2023/0353142 A1 | 11/2023 | Mouret et al. | |

FOREIGN PATENT DOCUMENTS

| | | |
|---|---|---|
| EP | 0818734 A2 | 1/1998 |
| JP | 2015122656 A | 7/2015 |
| JP | 6298629 B2 | 3/2018 |

* cited by examiner

SWITCHABLE TERMINATION RESISTANCE CIRCUIT

CROSS-REFERENCE TO RELATED APPLICATIONS

This application claims the priority under 35 U.S.C. § 119 of European Patent application no. 23305410.5, filed on 24 Mar. 2023, the contents of which are incorporated by reference herein.

FIELD

The disclosure relates to an apparatus comprising a switchable termination resistance circuit and a driving circuit. In particular, it relates to a transceiver comprising a switchable termination resistance circuit and a driving circuit.

BACKGROUND

In a communication system comprising a pair of transceivers passing differential signals along a transmission line, a termination resistance at each transceiver serves to reduce reflections along the transmission line.

SUMMARY

According to a first aspect of the present disclosure there is provided an apparatus comprising:
  a driving circuit;
  a switchable termination resistance circuit configured to selectively provide a resistance between a first terminal and a second terminal based on an output of the driving circuit, wherein the first and second terminals are for coupling to a communication bus;
  wherein the output of the driving circuit is provided by a parallel arrangement of a first branch having a first switch and a second branch having a second switch, wherein the second branch provides greater current than the first branch, and wherein the driving circuit is configured to provide, in response to an enable signal received at an input of the driving circuit, the output comprising a first current by turning on the second switch of the second branch for a predetermined time period following the provision of the enable signal to cause the switchable termination resistance circuit to provide the termination resistance, and, after said predetermined time period, turn off the second switch such that the output comprises a second current, less than the first current, provided via the first branch to maintain the provision of the termination resistance by the switchable termination resistance circuit.

In one or more embodiments, the parallel arrangement comprises:
  the first switch of the first branch coupled, by a first terminal, to a supply voltage line for receiving a supply voltage, and coupled to the switchable termination resistance circuit by a second terminal;
  the second switch of the second branch coupled, by a first terminal, to the supply voltage line, and coupled to the switchable termination resistance circuit by a second terminal;
  wherein the first switch is controlled by the enable signal; and
  wherein the second switch is controlled by a control circuit configured to: switch on the second switch in response to the switching on of the first switch; and switch off the second switch after said predetermined time period.

In one or more embodiments, the first switch comprises a PMOS switch and the first terminal comprises a source terminal and the second terminal comprises a drain terminal coupled to the switchable termination resistance circuit via a third PMOS switch;
  the second switch comprises a PMOS switch and the first terminal comprises a source terminal and the second terminal comprise a drain terminal coupled to the switchable termination resistance circuit via the third PMOS switch;
  wherein a gate terminal of the first switch is controlled by a control signal derived from the enable signal; and
  wherein a gate terminal of the second switch is controlled by the control circuit and the control circuit is configured to receive the control signal.

In one or more embodiments, the PMOS switch of the second switch has a greater width than the PMOS switch of the first switch.

In one or more embodiments, the control circuit comprises a high pass filter configured to switch off the second switch after said predetermined time period.

In one or more embodiments, the high pass filter comprises a first capacitor having a first plate configured to receive the control signal and a second plate coupled to the gate terminal of the second switch, and a first resistor having a first terminal coupled to the gate terminal of the second switch and a second terminal coupled to the supply voltage line.

In one or more embodiments, the control circuit comprises a first capacitor having a first plate configured to receive the control signal and a second plate coupled to the gate terminal of the second switch, and a fourth PMOS switch having a source terminal coupled to the supply voltage line, a drain terminal coupled to the gate terminal of the second switch and a gate terminal configured to receive the control signal.

In one or more embodiments, the driving circuit comprises a level shifter configured to receive the enable signal in a first voltage domain and provide the control signal for control of the parallel arrangement in a second voltage domain.

In one or more embodiments, the first and second terminals are for coupling to the communication bus via a capacitive coupling.

In one or more embodiments, the switchable termination resistance circuit comprises:
  the first and second terminals for connection to the communication bus;
  a first NMOS termination resistance switch and a second NMOS termination resistance switch having source connections connected together at a midpoint node and gate connections connected to an input node;
  a first resistor connected between the first terminal and a drain connection of the first NMOS termination resistance switch;
  a second resistor connected between the second terminal and a drain connection of the second NMOS termination resistance switch; and
  a Zener diode having a cathode side connected to the input node and an anode side connected to the midpoint node; and
  wherein the input node is configured to receive the output of the driving circuit.

In one or more embodiments, the output of the driving circuit is received at an input node of the switchable termination resistance circuit and wherein the driving circuit comprises:
- a first diode connected between a supply voltage line and the input node, the first diode having a cathode connected to the input node and an anode connected to the third PMOS switch; and
- a second diode connected between the input node and a ground voltage line, the second diode having an anode connected to the input node.

In one or more embodiments, the driving circuit comprises a level shifter and the parallel arrangement and wherein the level shifter comprises:
- a first NMOS switch, a second NMOS switch and a third NMOS switch having source connections connected to a ground voltage line, wherein the driving circuit is configured such that the enable signal is provided to the gate of the second NMOS switch and an inverse of the enable signal is provided to the gates of the first and third NMOS switches; and
- a first, level-shifter PMOS switch, a second, level-shifter PMOS switch, a third, level-shifter PMOS switch, a fourth, level-shifter PMOS switch, wherein a gate connection of the first, level-shifter PMOS switch is connected to a drain connection of the second, level-shifter PMOS switch; a gate connection of the second, level-shifter PMOS switch is connected to a drain connection of the first, level-shifter PMOS switch; source connections of the first and second level-shifter PMOS switches are connected to a supply voltage line; a source connection of the third, level-shifter PMOS switch is connected to the drain connection of the first, level shifter PMOS switch; a drain connection of the third, level shifter PMOS switch is connected to a drain connection of the first NMOS switch; a gate connection of the third, level-shifter PMOS switch is connected to a gate connection of the fourth, level-shifter PMOS switch; a source connection of the fourth, level-shifter PMOS switch is connected to the drain connection of the second, level-shifter PMOS switch; a drain connection of the fourth, level-shifter PMOS switch is connected to a drain connection of the second NMOS switch; and
- wherein the parallel arrangement comprises a first PMOS switch having a source connection coupled to the supply voltage line, and a second PMOS switch having a source connection coupled to the supply voltage line, and a third PMOS switch, wherein a drain connection of the first PMOS switch and the second PMOS switch is coupled to a source connection of the third PMOS switch; gate connections of the fourth, level-shifter PMOS switch and the third PMOS switch are connected together; and
- wherein the output of the driving circuit is received at an input node of the switchable termination resistance circuit and wherein the driving circuit further comprises: a first diode having an anode connected to a drain connection of the third PMOS switch and a cathode connected to the input node; and a second diode having an anode connected to the input node and a cathode connected to the drain connection of the third NMOS switch; and a 10 gate connection of the first PMOS switch is connected to the drain connection of the second, level shifter PMOS switch and the gate connection of the second PMOS switch is connected to a control circuit, the control circuit connected to drain connection of the second, level shifter PMOS switch and is configured to: switch on the second PMOS switch in response to the switching on of the first PMOS switch based on the voltage at the drain connection of the second, level shifter PMOS switch; and switch off the second PMOS switch after said predetermined time period.

In one or more embodiments, the driving circuit is configured such that absent the enable signal, the first switch of the first branch and the second switch of the second branch are switched off to cause the switchable termination resistance circuit to provide an open circuit.

In one or more embodiments, the apparatus comprises a transceiver.

In one or more embodiments, the apparatus comprises a battery cell controller.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The figures and Detailed Description that follow also exemplify various example embodiments. Various example embodiments may be more completely understood in consideration of the following Detailed Description in connection with the accompanying Drawings.

BRIEF DESCRIPTION OF THE DRAWINGS

One or more embodiments will now be described by way of example only with reference to the accompanying drawings in which.

DETAILED DESCRIPTION

Figure 1:
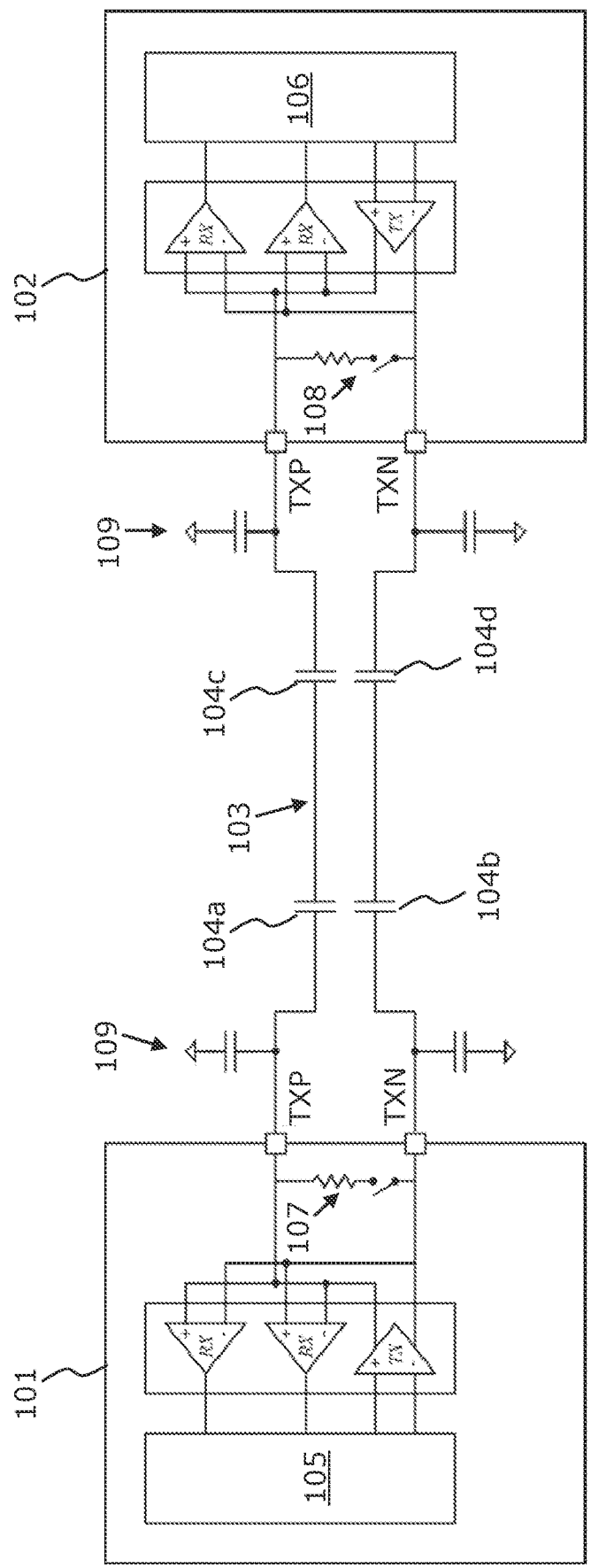
FIG. 1 shows an example embodiment of a communication system.

An example of a communication system comprising a pair of transceivers connected by a transmission line is illustrated in FIG. 1. The system 100 comprises first transceiver 101 and a second transceiver 102 connected by a transmission line 103, which in this example comprises a twisted wire pair. The transmission line 103 may comprise part of a communication bus. The communication system may be configured to communicate over the transmission line 103 by differential signalling. Each transceiver 101, 102 is the physical interface coupled to the twisted wire pair transmission medium. The transmission line 103 is isolated from the transceivers 101, 102 by a capacitor 104a, 104b in each of the respective wires at a first end of the transmission line 103 adjacent the first transceiver 101 and a capacitor 104c, 104d in each of the respective wires at a second end of the transmission line 103 adjacent the second transceiver 102. In the illustrated example, the first transceiver 101 is in transmit mode and the second transceiver 102 is in receive mode. Each transceiver 101, 102 comprises a pair of terminals TXP, TXN that connect to the transmission line 103 via the respective capacitors 104a, 104b, 104c, 104d.

It is known for twisted wire pair circuits, that may use differential signalling, to provide a termination resistor 107, 108 between the two wires of the wire pair. The termination resistor provides a function of draining energy from the twisted wire pair, or more generally the bus, and reducing reflections. In the present example embodiment, the termination resistor 107, 108 may be part of the first transceiver 101 and the second transceiver 102 respectively. In the present example, the termination resistor 107, 108 is switchable so that it can be selectively provided between the pair of terminals TXP, TXN.

Decoupling capacitors 109 are connected between each of the terminals TXP, TXN and ground. Each transceiver 101, 102, in the present example, comprises two receiver Amplifiers RX and one transmitter driver TX connected between the terminals TXP, TXN and a control module 105, 106.

Figure 2:
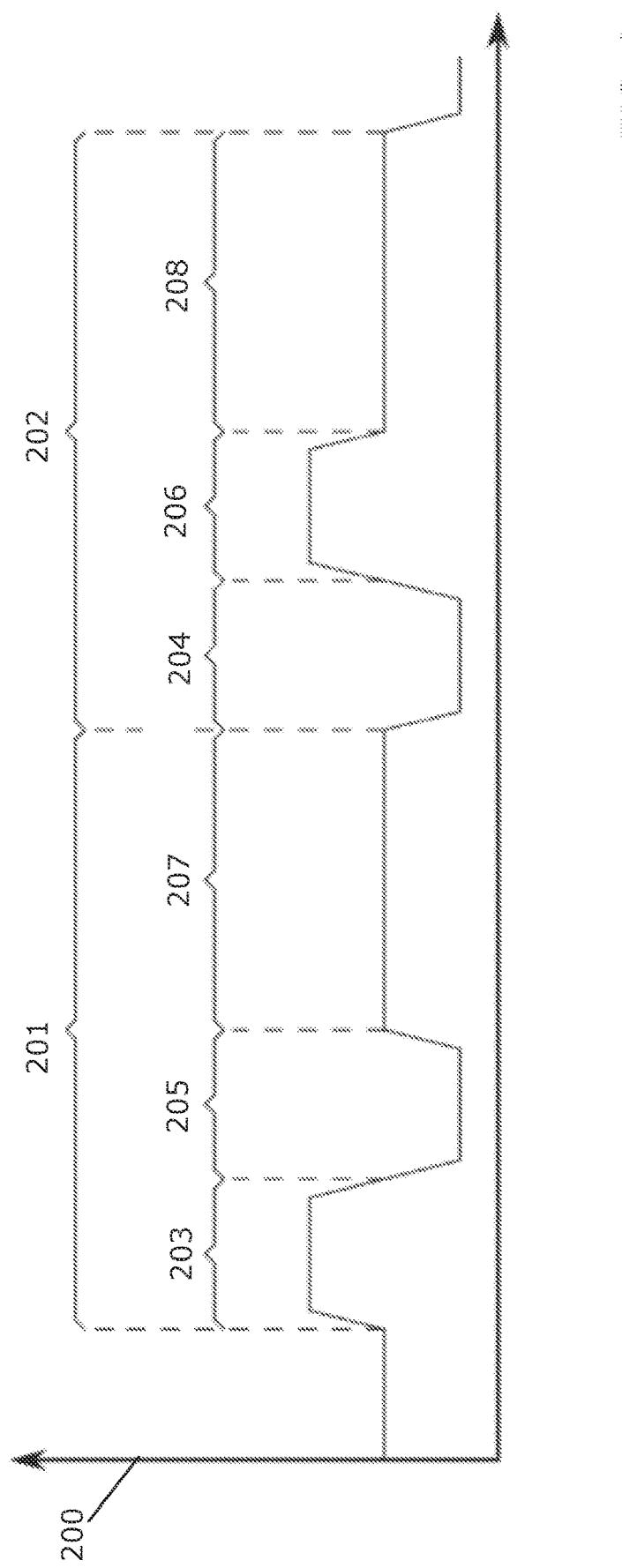
FIG. 2 shows schematically the differential voltage between terminals TXP, TXN as a function of time.

FIG. 2 illustrates schematically the differential voltage 200 between terminals TXP, TXN as a function of time at a transmitter during transmission of a logic level 1 at 201 followed by a logic level 0 at 202. For a logic level 1, the transmitter applies a positive differential voltage during a first phase 203, 204 followed by a negative differential voltage during a second phase 205, 206, and then followed by a zero differential voltage during a third phase 207, 208. The duration of the first and second phases is approximately the same, while the duration of the third phase is around twice that of each of the first and second phases. For a logic level 0, the transmitter first applies a negative differential voltage during a first phase, followed by a positive differential voltage in a second phase and a zero differential voltage in a third phase. Similar to that for a logic level 1, for the logic level 0 the third phase is around twice the length of each of the first and second phases.

To mitigate line attenuation, the differential voltage applied to the transmission line is made as high as possible. The power consumption of the transmitter mostly depends on the differential voltage applied and the bus load representing the equivalent resistance seen across the output connections TXP, TXN, which will include the termination resistance at the receiver side.

During the first and second phases, the transmitter power consumption will increase if the termination resistance is connected at the transmitter side. To reduce this, the termination resistance may be disconnected during the first and second phases to save on power consumption by the transmitter.

For line transmission systems where operation at high voltages under electromagnetic interference is required, for example in automotive applications, the design of a switchable termination resistance may be more complex due to the limited maximum acceptable gate voltage of MOSFETS, high electromagnetic interference and high common mode voltages.

In the present disclosure, the termination resistors are switchable and may be provided as part of the transceivers 101, 102. Further, it has been found that the provision of the switchable termination resistors in combination with a capacitively coupled bus leads to rectification of the signalling and high current draw. Embodiments are described that may be configured to reduce the current consumption of the switchable termination resistors.

Figure 3:
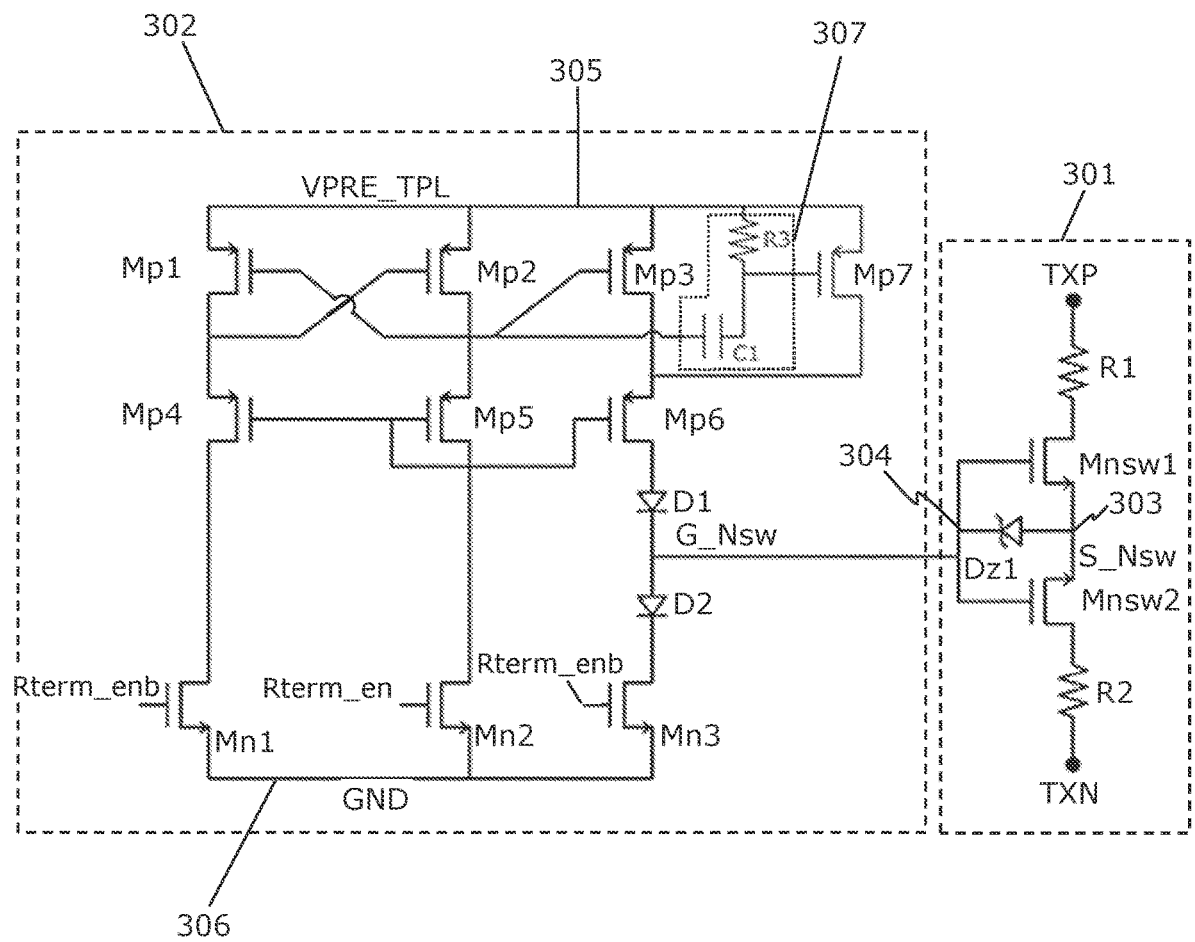
FIG. 3 shows a first example embodiment of the apparatus.

FIG. 3 illustrates a schematic diagram of an example switchable termination resistance circuit 301 with an associated driving circuit 302. The switchable termination resistance circuit 301 is connected between first and second terminals TXP, TXN of a transceiver, such as either of the transceivers 101, 102 illustrated in FIG. 1. The switchable termination resistance circuit 301 comprises first and second resistors R1, R2 connected to respective first and second terminals TXP, TXN. A first and a second NMOS termination resistance switches Mnsw1, Mnsw2 are connected in series between the first and second resistors R1, R2. Source connections of the termination resistance switches Mnsw1, Mnsw2 are connected together at a midpoint node 303 and drain connections of the termination resistance switches Mnsw1, Mnsw2 are connected to the respective first and second resistors R1, R2. Switching on the first and second termination resistance switches Mnsw1, Mnsw2 by applying a gate voltage to the gates of the termination resistance switches Mnsw1, Mnsw2 connects the first resistor R1 to the second resistor R2 via the first and second termination resistance switches Mnsw1, Mnsw2, thereby connecting a termination resistance between the first and second terminals TXP, TXN.

The total termination resistance comprises the first and second resistors R1, R2 in series, together with the source-drain resistances of the first and second termination resistance switches Mnsw1, Mnsw2 (which may be a few Ohms). Switching off the first and second termination resistance switches Mnsw1, Mnsw2 disconnects the termination resistance from the first and second terminals TXP, TXN, leaving the connection between terminals TXP, TXN open circuit.

The gate connections of the first and second termination resistance switches Mnsw1, Mnsw2 are connected to an input node 304, which is connected to an output of the driving circuit 302 for driving the switchable termination resistance circuit 301.

A Zener diode Dz1 is connected between the input node 304 and the midpoint node 303, the cathode of the Zener diode Dz1 being connected to the input node 304. The Zener diode Dz1 maintains a gate-source voltage across the first and second termination resistance switches Mnsw1, Mnsw2 within a set voltage range defined by the breakdown voltage of the Zener diode. The Zener diode Dz1 thereby allows the switchable termination resistance circuit 301 to operate in the presence of electromagnetic interference, which may result in high voltages being induced across the first and second terminals TXP, TXN.

The Zener diode may, for example, clamp the gate-source voltage across the termination resistance switches Mnsw1, Mnsw2 to 5V when the switchable terminal resistance circuit 301 is enabled.

During normal operation in the absence of electromagnetic interference, the common mode voltage on the transmission line connected to the first and second connections TXP, TXN may for example be around 2.5 V. To operate the first and second termination resistance switches Mnsw1, Mnsw2 a voltage at the input node 304 will need to be higher than around 5.5 V, but lower than the breakdown voltage of the Zener diode Dz1.

It will be appreciated that the switchable termination resistance circuit 301 may take other forms but, in general, is configured to provide either a termination resistance or an open circuit based on the output of the driving circuit 302.

In general, the driving circuit comprises a level shifter configured to receive an enable signal to selectively cause the provision of the termination resistance by the switchable termination resistance circuit 301, wherein an output current of the level shifter is provided by a parallel arrangement of a first branch and a second branch wherein the second branch provides greater current than the first branch. The driving circuit, in general, is configured to provide, in response to an enable signal received at an input of the level shifter, a first current via at least the second branch for a predetermined time period following the provision of the enable signal to cause the provision of the termination resistance by the switchable termination resistance circuit 301, and, after said predetermined time period provide a second current, less than the first current, to maintain the provision of the termination resistance by the switchable termination resistance circuit 301.

We will now describe an example embodiment of the driving circuit 302.

The driving circuit 302 provides the gate voltage G_Nsw to the input node 304 that operates the first and second termination resistance switches Mnsw1, Mnsw2. The driving circuit 302 is connected between a supply voltage line 305 providing a supply voltage VPRE_TPL (for example 7V) and a ground voltage line 306 at a ground voltage AGND (for example 0V).

As mentioned, the driving circuit 302 operates as a level shifter, allowing a low voltage digital input signal Rterm_en, Rterm_enb, to drive a higher voltage output signal G_Nsw, and allows the output voltage to float along with the voltage level at the midpoint node 303 of the switchable termination resistance circuit 301. To allow the output voltage to float, the driving circuit 302 comprises first and second diodes D1, D2 connected to the input node 304, the first diode D1 having its cathode connected to the input node 304 and the second diode D2 having its anode connected to the input node 304. Diodes D1, D2 prevent current flowing back into the driving circuit 302 from the switchable termination resistance circuit 301 in the presence of high levels of electromagnetic interference. In other examples, allowing the output voltage to float may not be necessary.

First, second and third NMOS switches Mn1, Mn2, Mn3 of the driving circuit 302 have source connections connected to the ground voltage line 305 and gate connections connected to receive a termination resistance enable signal Rterm_en or its inverse, Rterm_enb. Gate connections of the first and third NMOS switches Mn1, Mn3 receive Rterm_enb, while the second NMOS switch Mn2 receives Rterm_en.

The driving circuit 302 further comprises first, second, third, fourth, fifth, sixth and seventh PMOS switches Mp1-Mp7. Thus, the driving circuit 302 may be formed of an arrangement of MOSFET transistors. A gate connection of the first PMOS switch Mp1 is connected to a drain connection of the second PMOS switch Mp2.

A gate connection of the second PMOS switch Mp2 is connected to a drain connection of the first PMOS switch Mp1. Source connections of the first, second, third and seventh PMOS switches are connected to the supply voltage line 305. A gate connection of the third PMOS switch Mp3 is connected to the drain connection of the second PMOS switch Mp2.

A source connection of the fourth PMOS switch Mp4 is connected to the drain connection of the first PMOS switch Mp1 and a drain connection of the fourth PMOS switch Mp4 is connected to a drain connection of the first NMOS switch Mn1. A gate connection of the fourth PMOS switch Mp4 is connected to a gate connection of the fifth PMOS switch Mp5. A source connection of the fifth PMOS switch Mp5 is connected to the drain connection of the second PMOS switch Mp2. A drain connection of the fifth PMOS switch Mp5 is connected to a drain connection of the second NMOS switch Mn2.

Gate connections of the fifth and sixth PMOS switches Mp5, Mp6 are connected together. A source connection of the sixth PMOS switch Mp6 is connected to a drain connection of the third PMOS switch Mp3 and a drain connection of the seventh PMOS switch Mp7. A drain connection of the sixth PMOS switch Mp6 is connected to an anode connection of the first diode D1.

A drain connection of the third NMOS switch Mn3 is connected to the cathode connection of the second diode D2.

A gate connection of the seventh PMOS switch Mp7 is connected to a control circuit 307 configured to control when current flows through the seventh PMOS switch Mp7. The control circuit 307 may be configured to turn off the seventh PMOS switch Mp7 within the predetermined time period and/or in response to a signal.

In the present embodiment, the control circuit 307 comprises an RC circuit configured as a high-pass filter. In particular, the control circuit 307 comprises a first capacitor C1 and a third resistor R3. A first plate of the first capacitor is coupled to the drain connection of the second PMOS switch Mp2. A second plate of the first capacitor C1 is coupled to a first terminal of the third resistor R3 and also to the gate connection of the seventh PMOS switch Mp7. A second terminal of the third resistor R3 is coupled to the supply voltage line 305. The capacitance of the first capacitor C1 and the resistance of the third resistor R3 is selected to provide for passing of signals having a frequency greater than 10 MHz for examples, although it will be appreciated the frequency may be between 1-100 MHz or other values to achieve the desired change in the provision of the first current and the second current.

Thus, the third PMOS switch Mp3 and the seventh PMOS switch Mp7 form a parallel arrangement of switches in at least two branches between the supply voltage line 305 and the sixth PMOS switch Mp6 to control the amount of current that flows to the input node 304 for control of the switchable termination resistance circuit 301. In one or more examples, the seventh PMOS switch Mp7 has a greater width than the third PMOS switch Mp3 such that it allows for a greater flow of current relative to the third PMOS switch Mp3.

The provision of the parallel arrangement provides a first branch of the third PMOS switch Mp3 and a second branch comprising the seventh PMOS switch Mp7. Thus, the two branches provide the voltage and associated current at node G_Nsw. The third PMOS switch Mp3 of the first branch is configured to provide a current to keep the G_Nsw signal in a "high-state" with low steady-state current after the switchable termination resistance circuit 301 is turned on. The seventh PMOS switch Mp7 of the second branch with the control circuit 307 (of R3 and C1 in this example) is configured to allow for current flow therethrough during a short predetermined time period when the switchable termination resistance circuit 301 transitions from a turned-off state (wherein the switchable termination resistance circuit 301 provides an open circuit between TXP and TXN) to a turned-on state (wherein the switchable termination resistance circuit 301 provides the termination resistance between TXP and TXN).

Thus, the second branch is configured to push a strong current during the short predetermined time period in order to charge the gate of Mnsw1 and Mnsw2 to activate the termination resistance of the switchable termination resistance circuit 301.

The control circuit 307, which may comprise a high pass filter created by R3/C1 is configured to make the gate of the seventh PMOS switch Mp7 follow the gate of third PMOS switch Mp3 when the gate of third PMOS switch Mp3 is turned on. So, at a time of turn on of the third PMOS switch Mp3, the control circuit 307 is configured such that the seventh PMOS switch Mp7 is also turned on.

As mentioned previously, the current handling capacity of the seventh PMOS switch Mp7 may be configured to be very large compared to the current handling capacity of the third PMOS switch Mp3, which allows the node G_Nsw to be charged in a very short time despite any large capacitance of this node. In other examples, not shown, only the second branch of Mp7 is initially providing current to activate the switchable termination resistance circuit 301, wherein the current is subsequently solely provided by the first branch of Mp3 to maintain the switchable termination resistance circuit 301 in the provision of the termination resistance.

In more detail, to turn on the termination resistance, the enable signal Rterm_en is provided to the second NMOS switch Mn2 and the inverse Rterm_enb ("Rterm_en bar") to the first and third NMOS switches Mn1, Mn3. In this example, the voltage applied at the input node 304 is then the supply voltage VPRE_TPL minus one diode voltage, i.e., the voltage across the first diode D1 and minus the drop voltage across Mp3 and Mp6. The supply voltage VPRE_TPL needs to be sufficient to pull the gates of the termination switches Mnsw1, Mnsw2 but lower than that required to drive current through the Zener diode Dz1.

On the provision of the enable signal, current flows through both the third PMOS switch Mp3 and the seventh PMOS switch Mp7 to provide the current required to turn on the switchable termination resistance circuit 301 within a desired predetermined time, such that it provides the termination resistance.

However, the control circuit 307 is configured to turn off the seventh PMOS switch Mp7 a short predetermined time after the provision of the enable signal. Thus, the control circuit 307 may be configured to control the gate of the seventh PMOS switch Mp7 based on expiration of a predetermined time after the provision of the enable signal (i.e. a transition from non-provision of the enable signal to provision of the enable signal). A timer may be provided as part of the control circuit for such a purpose. However, in the present example, this functionality is provided by the high-pass filter formed by R3 and C1. When there is a transition of Rterm_en from '0' to '1' the drain voltage of Mp2 will change from a voltage at VPRE_TPL supply to a lower value (for example VPRE_TPL minus 5V). In this very fast transition (changes occurs in few nanoseconds) the gate of Mp3 will go down from VPRE_TPL to VPRE_TPL minus 5V in few nanoseconds (for example) and so the seventh PMOS switch Mp7 will do the same since capacitor C1 acts like a short circuit during a short period of time. Thus, the gate voltage of the seventh PMOS switch Mp7 will follow the voltage of the third PMOS switch Mp3 and then the R3 resistor will discharge the gate of Mp3 and this voltage will raise to VPRE_TPL supply.

To turn off the termination resistance provided by the switchable termination resistance circuit 301, the third NMOS switch Mn3 is turned on with Rterm_enb, which pulls down the drain of the NMOS switch Mn3 and the gate voltage at the input node 304 to one diode voltage above ground, thereby turning off the termination resistance switches Mnsw1, Mnsw2.

The present driving circuit 302 may be particularly suited for providing a termination resistance between first and second wires of a capacitive communication bus. The capacitive communication bus is provided by the first and second transceiver being coupled to the communication bus via the capacitors 104a-d as shown in FIG. 1. The provision of the two branches and the control circuit 307 has been found, in one or more examples, to reduce the rectification and drastically reduce current consumption in case of EMC perturbation. It has been found that the present example implementation could handle EMC perturbation as high as +/−40V for capacitive communication. It therefore may also provide for communication robustness.

The provision of the two branches wherein one of the branches is used to provide current to turn on the switchable termination resistance circuit 301 (possibly in combination with the other branch) and wherein the other of the two branches provides a lower level of current to keep the switchable termination resistance circuit 301 in the on-state has been found to be advantageous.

In some examples, the level shifter may not be required and the enable signal may be of a sufficient voltage to provide the required actions of Mp3, Mp7 and Mp6.

Further, the present driving circuit 302 may have particular application providing communication functionality as part of a battery cell controller.

We now summarise the component parts of FIG. 3 divided between the functional parts of the circuit, which comprise the level shifter and the parallel arrangement. The parallel arrangement may be considered to comprise a first PMOS switch Mp3 in the first branch and a second PMOS switch Mp7 in the second branch. The parallel arrangement includes a third PMOS switch Mp6 to couple it to the input node 304 of the switchable termination resistance circuit 301 (via the arrangement of the first and second diodes D1, D2). The level shifter may be considered to comprise a first level shifter PMOS switch Mp1, a second level shifter PMOS switch Mp2, a third level shifter PMOS switch Mp4 and a fourth level shifter PMOS switch Mp5 as well as a first NMOS switch Mn1, a second NMOS switch Mn2, and a third NMOS switch Mn3 having source connections connected to a ground voltage line.

Figure 4:
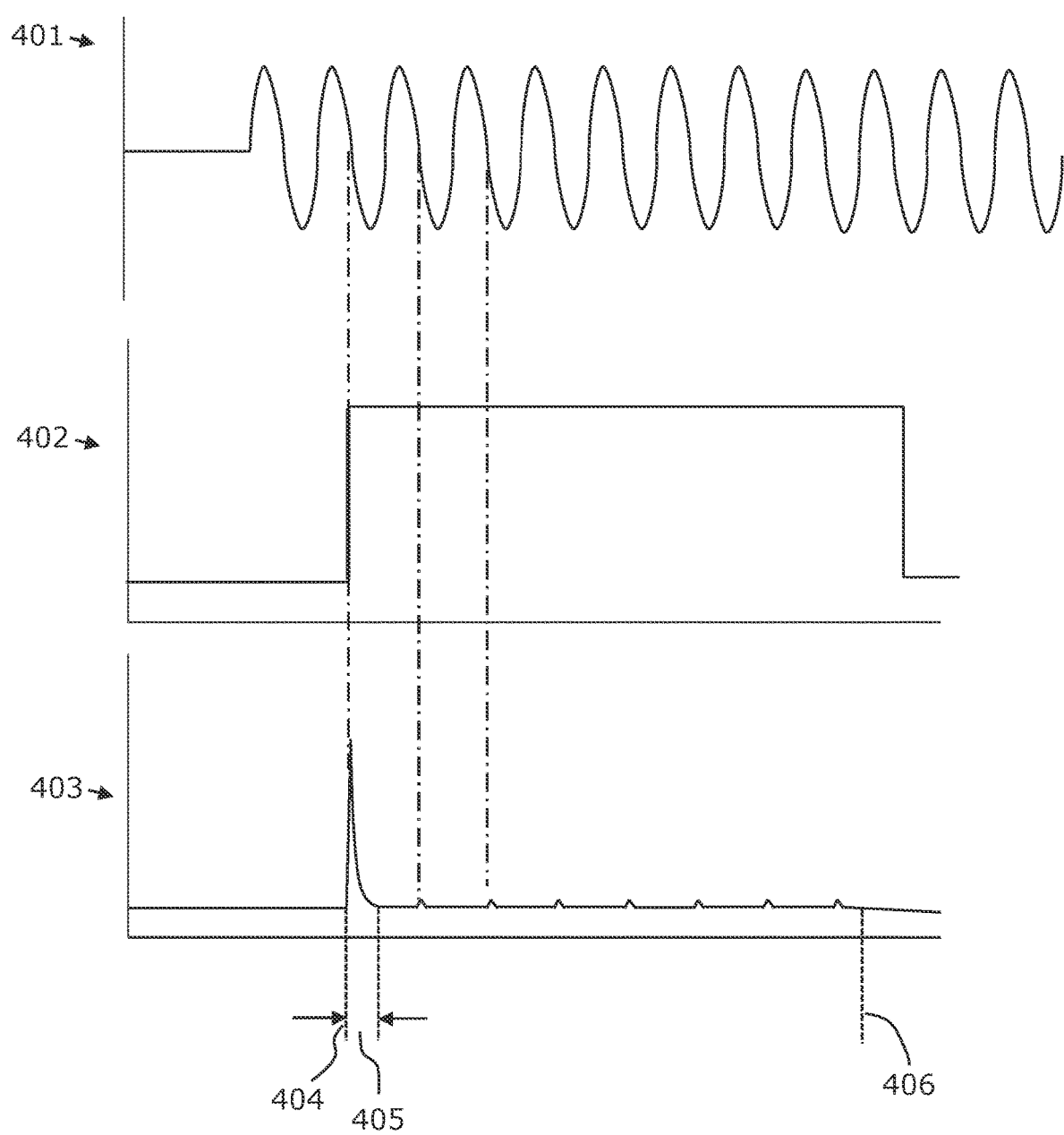
FIG. 4 shows three example graphs illustrating the operation of the apparatus.

FIG. 4 shows three traces comprising a first trace 401 simulating a +/−40V sinusoidal signal on TXP/TXN pins. The second trace 402 shows the voltage of the enable signal Rterm_en that is rising and then falling over a longer time period. It will be appreciated that Rterm_enb is the inverse of the enable signal Rterm_en. The third trace 403 shows the current flowing from Mp3, Mp7 and Mp6 to the switchable termination resistance circuit 301.

As shown by trace 402, at the time of activation of the enable signal and therefore the switchable termination resistance circuit 301, the first branch of Mp3 and second branch of Mp7 provide current as shown by the spike in current at time 404. After the predetermined time period, shown as period 405, the second branch is deactivated by the control circuit 307. Thus, in terms of current consumption, we see that for the first negative alternance of the sinusoidal signal 401, there is a current injected by the driver circuit 302 in the bus but once the control circuit 307 deactivates the second branch of Mp7, much lower currents flow for each subsequent negative alternance of the sinusoidal signal 401. It may be that the current consumed after time period 405 is almost forty times lower than if Mp7 was not deactivated.

Thus, the higher levels of current provided during period 405 enables fast switch on of the switchable termination resistance circuit 301, but after switch on, the current consumption/leakage is limited/reduced due to the control circuit 307 deactivating the second branch of Mp7. This is advantageous because during the third 3rd phase (see FIG. 2) for the transmitter, it is advantageous to reconnect the termination resistance in less than a few nanoseconds, such as less than 10 nanoseconds, while current consumption is low.

Figure 5:
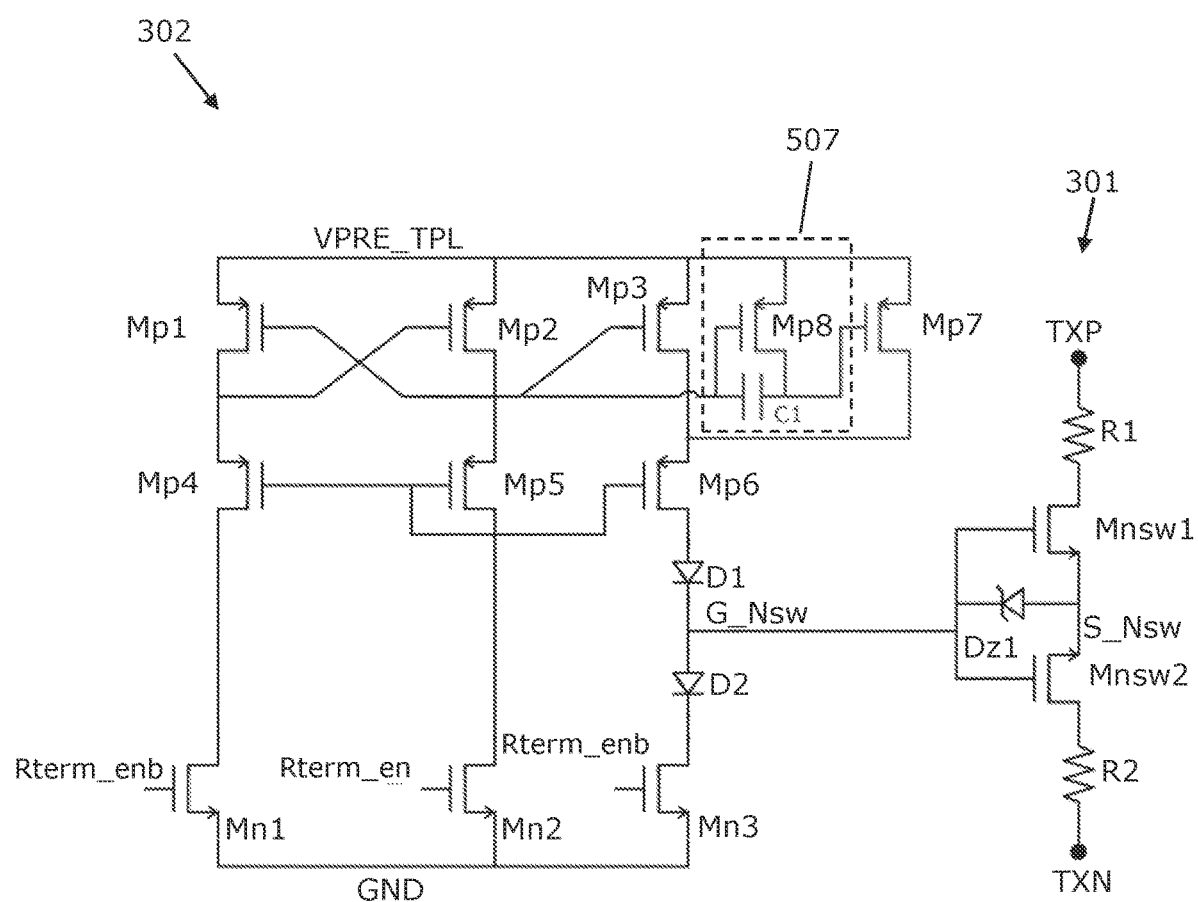
FIG. 5 shows a second example embodiment of the apparatus.

FIG. 5 shows a second embodiment of the driver circuit 302 and the switchable termination resistance circuit 301. However, in this example a second embodiment of the control circuit 507 is shown.

In this example, the control circuit 507 comprises the first capacitor C1 but the third R3 is omitted. A first plate of the first capacitor is coupled to the drain connection of the second PMOS switch Mp2. A second plate of the first capacitor C1 is coupled to the gate connection of the seventh PMOS switch Mp7. An eighth PMOS switch Mp8 is provided having a source terminal coupled to the supply voltage line 305, a drain terminal coupled to the gate connection of the seventh PMOS switch Mp7 and a gate connection coupled to the first plate of the first capacitor C1.

Mp8 acts as a switch. At the beginning, when there is a transition of Rterm_en/Rterm_enb that indicates that the termination resistance needs to be turned ON, the voltage on gate of Mp3 is pulled down from VPRE_TPL voltage to VPRE_TPL minus e.g. 5V in few nanoseconds. Mp3 is so turned on and C1 is coupling the signal during a short predetermined period to the gate of Mp7 so Mp7 is turned ON also. But Mp8 in this case is also turned on because its source-gate voltage is equal to e.g. 5V (source voltage at VPRE_TPL value and gate at VPRE_TPL minus 5V, for example). So, automatically, it discharges the voltage on the gate of Mp7 to turn off Mp7.

In a further example, not shown, C1, R3 and Mp8 are omitted and instead, a second branch control signal is applied directly to the gate of the seventh PMOS switch Mp7 to control the flow of current through the seventh PMOS switch Mp7. The second branch control signal may be provided the predetermined time period after the enable signal by the same or a difference controller to that which provides the enable signal.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. An apparatus comprising:
a driving circuit;
a switchable termination resistance circuit configured to selectively provide a resistance between a first terminal and a second terminal based on an output of the driving circuit, wherein the first and second terminals are for coupling to a communication bus;
wherein the output of the driving circuit is provided by a parallel arrangement of a first branch having a first switch and a second branch having a second switch, wherein the second branch provides greater current than the first branch, and wherein the driving circuit is configured to provide, in response to an enable signal received at an input of the driving circuit, the output comprising a first current by turning on the second switch of the second branch for a predetermined time period following the provision of the enable signal to cause the switchable termination resistance circuit to provide the termination resistance, and, after said predetermined time period, turn off the second switch such that the output comprises a second current, less than the first current, provided via the first branch to maintain the provision of the termination resistance by the switchable termination resistance circuit.

2. The apparatus of claim 1, wherein the parallel arrangement comprises:
the first switch of the first branch coupled, by a first terminal, to a supply voltage line for receiving a supply voltage, and coupled to the switchable termination resistance circuit by a second terminal;
the second switch of the second branch coupled, by a first terminal, to the supply voltage line, and coupled to the switchable termination resistance circuit by a second terminal;
wherein the first switch is controlled by the enable signal; and
wherein the second switch is controlled by a control circuit configured to: switch on the second switch in response to the switching on of the first switch; and switch off the second switch after said predetermined time period.

3. The apparatus of claim 2, wherein:
the first switch comprises a PMOS switch and the first terminal comprises a source terminal and the second terminal comprises a drain terminal coupled to the switchable termination resistance circuit via a third PMOS switch;
the second switch comprises a PMOS switch and the first terminal comprises a source terminal and the second terminal comprise a drain terminal coupled to the switchable termination resistance circuit via the third PMOS switch;
wherein a gate terminal of the first switch is controlled by a control signal derived from the enable signal; and
wherein a gate terminal of the second switch is controlled by the control circuit and the control circuit is configured to receive the control signal.

4. The apparatus of claim 3, wherein the PMOS switch of the second switch has a greater width than the PMOS switch of the first switch.

5. The apparatus of claim 3, wherein the control circuit comprises a high pass filter configured to switch off the second switch after said predetermined time period.

6. The apparatus of claim 5, wherein the high pass filter comprises a first capacitor having a first plate configured to receive the control signal and a second plate coupled to the gate terminal of the second switch, and a first resistor having a first terminal coupled to the gate terminal of the second switch and a second terminal coupled to the supply voltage line.

7. The apparatus of claim 3, wherein the control circuit comprises a first capacitor having a first plate configured to receive the control signal and a second plate coupled to the gate terminal of the second switch, and a fourth PMOS switch having a source terminal coupled to the supply voltage line, a drain terminal coupled to the gate terminal of the second switch and a gate terminal configured to receive the control signal.

8. The apparatus of claim 3, wherein the driving circuit comprises a level shifter configured to receive the enable signal in a first voltage domain and provide the control signal for control of the parallel arrangement in a second voltage domain.

9. The apparatus of claim 1, wherein the first and second terminals are for coupling to the communication bus via a capacitive coupling.

10. The apparatus of claim 1, wherein the switchable termination resistance circuit comprises:
the first and second terminals for connection to the communication bus;
a first NMOS termination resistance switch and a second NMOS termination resistance switch having source connections connected together at a midpoint node and gate connections connected to an input node;
a first resistor connected between the first terminal and a drain connection of the first NMOS termination resistance switch;
a second resistor connected between the second terminal and a drain connection of the second NMOS termination resistance switch; and
a Zener diode having a cathode side connected to the input node and an anode side connected to the midpoint node; and
wherein the input node is configured to receive the output of the driving circuit.

11. The apparatus of claim 3, wherein the output of the driving circuit is received at an input node of the switchable termination resistance circuit and wherein the driving circuit comprises:
a first diode connected between a supply voltage line and the input node, the first diode having a cathode connected to the input node and an anode connected to the third PMOS switch; and
a second diode connected between the input node and a ground voltage line, the second diode having an anode connected to the input node.

12. The apparatus of claim 1, wherein the driving circuit comprises a level shifter and the parallel arrangement and wherein the level shifter comprises:
a first NMOS switch, a second NMOS switch and a third NMOS switch having source connections connected to a ground voltage line, wherein the driving circuit is configured such that the enable signal is provided to the gate of the second NMOS switch and an inverse of the enable signal is provided to the gates of the first and third NMOS switches; and
a first, level-shifter PMOS switch, a second, level-shifter PMOS switch, a third, level-shifter PMOS switch, a fourth, level-shifter PMOS switch, wherein a gate connection of the first, level-shifter PMOS switch is connected to a drain connection of the second, level-shifter PMOS switch; a gate connection of the second, level-shifter PMOS switch is connected to a drain connection of the first, level-shifter PMOS switch; source connections of the first and second level-shifter PMOS switches are connected to a supply voltage line; a source connection of the third, level-shifter PMOS switch is connected to the drain connection of the first, level shifter PMOS switch; a drain connection of the third, level shifter PMOS switch is connected to a drain connection of the first NMOS switch; a gate connection of the third, level-shifter PMOS switch is connected to a gate connection of the fourth, level-shifter PMOS switch; a source connection of the fourth, level-shifter PMOS switch is connected to the drain connection of the second, level-shifter PMOS switch; a drain connection of the fourth, level-shifter PMOS switch is connected to a drain connection of the second NMOS switch; and
wherein the parallel arrangement comprises a first PMOS switch having a source connection coupled to the supply voltage line, and a second PMOS switch having a source connection coupled to the supply voltage line, and a third PMOS switch, wherein a drain connection of the first PMOS switch and the second PMOS switch is coupled to a source connection of the third PMOS switch; gate connections of the fourth, level-shifter PMOS switch and the third PMOS switch are connected together; and
wherein the output of the driving circuit is received at an input node of the switchable termination resistance circuit and wherein the driving circuit further comprises: a first diode having an anode connected to a drain connection of the third PMOS switch and a cathode connected to the input node; and a second diode having an anode connected to the input node and a cathode connected to the drain connection of the third NMOS switch; and a gate connection of the first PMOS switch is connected to the drain connection of the second, level shifter PMOS switch and the gate connection of the second PMOS switch is connected to a control circuit, the control circuit connected to drain connection of the second, level shifter PMOS switch and is configured to: switch on the second PMOS switch in response to the switching on of the first PMOS switch based on the voltage at the drain connection of the second, level shifter PMOS switch; and switch off the second PMOS switch after said predetermined time period.

13. The apparatus of claim 1, wherein the driving circuit is configured such that absent the enable signal, the first switch of the first branch and the second switch of the second branch are switched off to cause the switchable termination resistance circuit to provide an open circuit.

14. The apparatus of claim 1, wherein the apparatus comprises a transceiver.

15. The apparatus of claim 1, wherein the apparatus comprises a battery cell controller.

16. The apparatus of claim 3, wherein the first and second terminals are for coupling to the communication bus via a capacitive coupling.

17. The apparatus of claim 3, wherein the switchable termination resistance circuit comprises:
the first and second terminals for connection to the communication bus;
a first NMOS termination resistance switch and a second NMOS termination resistance switch having source connections connected together at a midpoint node and gate connections connected to an input node;

a first resistor connected between the first terminal and a drain connection of the first NMOS termination resistance switch;

a second resistor connected between the second terminal and a drain connection of the second NMOS termination resistance switch; and a Zener diode having a cathode side connected to the input node and an anode side connected to the midpoint node; and wherein the input node is configured to receive the output of the driving circuit.

18. The apparatus of claim 3, wherein the driving circuit is configured such that absent the enable signal, the first switch of the first branch and the second switch of the second branch are switched off to cause the switchable termination resistance circuit to provide an open circuit.

19. The apparatus of claim 3, wherein the apparatus comprises a transceiver.

20. The apparatus of claim 3, wherein the apparatus comprises a battery cell controller.

* * * * *